(12) United States Patent
Meng et al.

(10) Patent No.: US 6,322,891 B1
(45) Date of Patent: Nov. 27, 2001

(54) THERMALLY-DIFFUSED BORON DIAMOND AND ITS PRODUCTION

(75) Inventors: Yue Meng, Columbus, OH (US); Thomas R. Anthony, Schenectady, NY (US)

(73) Assignee: General Electric Company, Pittsfield, MA (US)

( * ) Notice: Subject to any disclaimer, the term of this patent is extended or adjusted under 35 U.S.C. 154(b) by 0 days.

(21) Appl. No.: 09/561,128

(22) Filed: Apr. 28, 2000

(51) Int. Cl.[7] .............................. B32B 5/16; C23C 8/154
(52) U.S. Cl. ...................... 428/402; 428/403; 428/404; 427/590
(58) Field of Search ................................. 428/402, 403, 428/404; 427/590

(56) References Cited

PUBLICATIONS

Ed. by J. E. Field "The Properties of Natural and Synthetic Diamond", 1992; pp. 489–490.
Thomas R. Anthony "Diamond and Related Materials 4", 1995; pp. 1346–1352.
T. R. Anthony, Diamond and Related Materials 4 pp. 1346–1352, Jul. 1995.*

* cited by examiner

Primary Examiner—Leszek Kiliman
(74) Attorney, Agent, or Firm—Mueller and Smith, LPA

(57) ABSTRACT

A method for treating diamond for improving the oxidation resistance and the mechanical strength of said diamond crystals includes forming a mixture of diamond crystals, a source of boron, and inert particles. This mixture is heated at a temperature of between about 800° and 1200° C. for a time adequate to diffuse boron into the surface of the diamond crystals for improving the oxidation resistance and the mechanical strength of the boron-diffused diamond crystals. The resulting diamond crystals have improved oxidation resistance and improved mechanical strength by virtue of having had boron thermally diffused into the surface of thereof.

16 Claims, 2 Drawing Sheets

THERMALLY-DIFFUSED BORON DIAMOND AND ITS PRODUCTION

CROSS-REFERENCE TO RELATED APPLICATIONS

None

STATEMENT REGARDING FEDERALLY SPONSORED RESEARCH

Not applicable.

BACKGROUND OF THE INVENTION

The present invention relates generally to diamond particles and more particularly to increasing their compressive fracture strength and improving their oxidation resistance by thermally diffusing boron (B) into the top layer of the diamond crystal.

Its hardness and thermal properties are but two of he characteristics that make diamond useful in a variety of industrial components. Initially, natural diamond was used in a variety of abrasive applications. With the ability to synthesize diamond by high pressure/high temperature (HP/HT) techniques utilizing a catalyst/sintering aid under conditions where diamond is the thermodynamically stable form of carbon phase, a variety of additional products found favor in the marketplace. HP/HT conditions typically comprehend conditions such that the diamond is thermodynamically stable. Typically, this includes a temperature in the range of about 1500° to 2700° C. and a pressure in the range of about 5 to 20 GPa. Polycrystalline diamond compacts, often supported on a WC support in cylindrical or annular form, extended the product line for diamond additionally. However, the requirement of high pressure and high temperature has been a limitation in product configuration, for example. Of more recent vintage, is the low-pressure growth of diamond, dubbed "chemical vapor deposition" or "CVD" in the field. Additional product configuration is permitted by this diamond growth technique.

Regardless of whether the diamond is natural or synthetic, and regardless of the manner in which the synthetic diamond has been grown, diamond suffers from being unstable at elevated temperature. As the art is well aware, processing of diamond at temperatures of above 600° to 700° C. requires an inert atmosphere; otherwise, the diamond will oxidize. Thus, the ability to increase the oxidation resistance of diamond would be welcome in the art. For example, increased processing of diamond into various tools and workpieces would be permitted.

Another valuable property of diamond is its compressive fracture strength. Compressive fracture strength measures the mechanical strength of a diamond crystal and is the static force required to break (or fracture) the crystal. Compressive fracture strength is a quantifiable mechanical property of diamond grit. Typically, hundreds of grit are tested and the average force recorded to break the grit is used as the compressive fracture strength of that particular grit product. Heretofore, etching of diamond grit for one hour in molten potassium nitrate at 870° K was reported to increase the strength of the diamond grit due to the removal of surface roughness and defects (See pp. 489–490, *The Properties of Natural and Synthetic Diamond*, Ed. by J. E. Field, 1992).

BRIEF SUMMARY OF THE INVENTION

A method for treating diamond for improving the oxidation resistance and mechanical strength of said diamond crystals includes forming a mixture of diamond crystals, a source of boron, and inert particles. This mixture is heated at a temperature of between about 800° C. and 1200° C. for a time adequate to diffuse boron into the surface of the diamond crystals for improving the oxidation resistance and mechanical strength of the boron-diffused diamond crystals. The resulting diamond crystals have improved oxidation resistance and mechanical strength by virtue of having had boron thermally diffused into the surface of thereof.

BRIEF DESCRIPTION OF THE DRAWINGS

For a fuller understanding of the nature and objects of the present invention, reference should be made to the following detailed description taken in conjunction with the accompanying drawings, in which.

Figure 1:
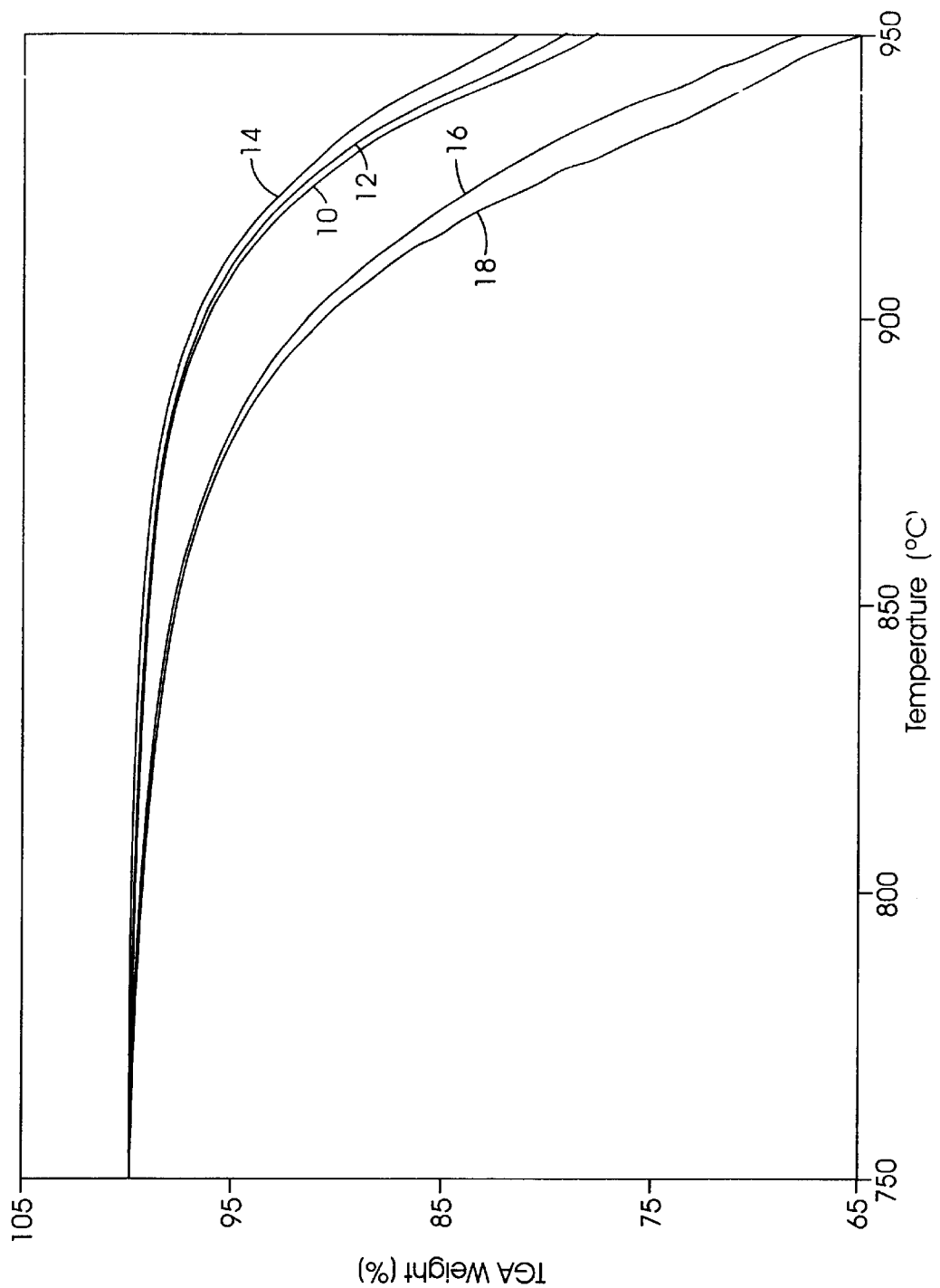
FIG. 1 is the graphical plot of the thermogravimetric analysis results of samples of boron diffused diamond samples and untreated diamond samples.

The drawings will be described in detail in the Examples.

DETAILED DESCRIPTION OF THE INVENTION

The present invention has applicability to diamond in general regardless of whether the diamond is natural or manufactured. Manufactured diamond includes CVD produced diamond, HP/HT produced diamond, or any other technique for producing diamond.

Boron is one of only two elements (nitrogen being the other) that can substitute for the carbon atom in the diamond structure. Boron's substitution in the top layer (or at the surface) of diamond enables the boron-doped diamond to exhibit improved mechanical strength and oxidation resistance. While the exact mechanism of action has yet to be clarified, the improved mechanical property may be attributed to two possible mechanisms. It is known that boron atoms diffuse into the outmost layer of diamond lattice and into the surface cracks of the diamond crystal. The presence of boron atoms in the outmost layer of a diamond crystal may cause an expansion of the diamond lattice and generate a compressive tangential stress on the surface of the diamond crystal. This compressive stress state on the diamond surface may make the diamond more resistant to tensile failure and fracture and, therefore, will toughen and strengthen the diamond (See Anthony, *Diamond and Related Materials* 4, (1995) pp. 1346–1352). In addition, boron atoms also may be diffusing into the submicroscopic cracks and other defects on the surface of a diamond crystal. The boron filling at a crack tip may increase the effective radius of the tip, which in turn may reduce the stress level concentrated at the crack tip and retard or stop its propagation. Boron atoms further may form bonds with carbon atoms inside a crack. If such bond formation occurs, the "blunting" affect would be expected to be more effective than boron atoms merely filling in the crack space. Regardless of the mechanism of action, the data will amply demonstrate that the boron treatment of diamond grit indeed does improve the oxidation resistance and mechanical strength of the thus-treated grit.

As the data will demonstrate, the boron-diffused diamond crystals of the present invention not only exhibit improved mechanical strength, but also have improved oxidation resistance. That is, the boron-diffused diamond crystals can tolerate higher temperature excursions without oxidation of the diamond by dint of the boron's presence. This means that tool manufacturing can proceed at a higher temperature which can be advantageous to tool manufacturers. Moreover, this also means that the ultimate tools also can be used in tasks that heretofore were foreclosed to diamond because of the expected temperatures that would be encountered in the field. Such advantages should not be limited to any particular tools. That is, the boron-diffused diamond should have advantage in compacts, wire drawing dies, resin bond tools, metal bond tools, saw blades, and the like.

The initial step of the process commences with formation of a uniform mixture of boron and alumina particles. The alumina mixture serves as an intermediate material between diamond particles for the purpose of evenly distributing heat and boron composition. The particle size of alumina powder can range from about 1 $\mu$m to −100 mesh in size. Other inert particles that could substitute for alumina are magnesium oxide, silicon oxide, and the like and mixtures thereof.

The preferred source of boron is boron powder ranging in particle size from about 5 $\mu$m to −80 mesh in size. Again, the lower limit is more dictated by handling considerations, especially at commercial scale operations. From about 1 to about 10 wt-% by weight of boron should be included in the mixture.

The last formation step is to add diamond particles into the boron-alumina mixture. The diamond particles can range on up to about 900 $\mu$m in size. There is no practical lower limit on diamond particle size as even diamond fines will benefit from the present boron diffusion process.

In practicing the boron diffusion process, the mixture is placed within an oven or treated that is capable of having an inert atmosphere established. Argon is a convenient inert gas of choice for establishing an inert atmosphere within the treated; although, a variety of additional inert gases could be used, such as, for example, helium, neon, and xenon.

The first step of the treating process is to establish the inert atmosphere. Thereafter, the treated is heated to a temperature ranging from about 800° to 1200° C. Such elevated temperature is maintained for a time ranging from about 2 to about 4 hours. Thereafter, the temperature first is lowered and then the inert atmosphere replaced by air. It will be apparent that the diamond preferably should not be exposed to elevated temperatures unless an inert atmosphere is present in order to minimize any unwanted thermal degradation of the diamond.

The resulting boron-diffused diamond product has boron present only in the top layer (or at the surface) of the diamond. Its presence, however, is sufficient to improve both the oxidation resistance of the treated diamond as well as improve its mechanical strength.

While the invention has been described with reference to a preferred embodiment, those skilled in the art will understand that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. In this application all units are in the metric system and all amounts and percentages are by weight, unless otherwise expressly indicated. Also, all citations referred herein are expressly incorporated herein by reference.

IN THE EXAMPLES

Thermogravimetric analysis (TGA) is a continuous measurement of sample weight under elevated temperature conditions in a static "air" atmosphere. A decrease in sample weight is indicative of volatile reaction products being evolved from the sample. For diamond, oxygen will react at elevated temperature to form CO, $CO_2$, and mixtures thereof. J. E. Field (Editor), *The Properties of Diamond*, Academic Press, New York, N.Y. (1979). TGA curves reported herein were generated on a 951 Thermogravimetric Analyzer by DuPont Instruments with all samples being placed on a platinum sample holder. The temperature was increased at a rate of 10° C./min.

Example 1

Diamond crystals (5 g, 45/50 mesh, 340 $\mu$m in average particle size), $Al_2O_3$ (10 g), and B powder (0.5 g) were placed in a covered porcelain crucible in a thermal treater. An argon atmosphere was established in the treated. The temperature in the treated was raised to about 910° C. for 2 hours. The treated temperature was reduced to room temperature and the argon atmosphere replaced with air. The treated diamond crystals were removed from the treated and tested as follows.

The first test was a compressive fracture strength (CFS) test. For each sample, 1000 crystals were sent through the tester one by one, the static force needed to break each crystal was recorded. The compressive fracture strength of the tested sample is the average of the forces recorded. Three duplicate samples of B treated and untreated diamond crystals were tested with the following results being recorded.

TABLE 1

| SAMPLE NO. | B TREATED (lb) | UNTREATED (lb) |
|---|---|---|
| 1 | 66.9 | 62.5 |
| 2 | 65.9 | 61.9 |
| 3 | 65.0 | 61.5 |
| Average | 65.9 | 61.9 |

Statistical analysis of these test results (t-Test: Two-Sample Assuming Unequal Variances) confirmed the reliability thereof, P (T≦t) one-tail of 0.0039 and P (T≦t) two-tail of 0.0078. Thus, these results demonstrate that the B doped diamond crystals have improved compressive fracture strength by virtue of the boron treatment.

Example 2

Additional samples of diamond crystals (same source as described in Example 1) were treated in the manner described in Example 1 with different amounts of boron. TGA showed weight loss of the untreated sample and the treated sample with 0 wt-% B at a lower temperature than the treated samples with 1 wt-% and 5 wt-% B. This is evident by viewing FIG. 1. Lines 10, 12, and 14 display the TGA results for samples with 1 wt-% B and two samples with 5 wt-% B. It is interesting to note that the results reveal little difference between these three B diffused samples. The untreated samples and the treated sample with 0 wt-% B represented by lines 16 and 18, also reveal little difference between them. The main difference is between the boron treated and the non-boron treated diamond samples. Improved oxidation resistance, then, is demonstrated for the novel boron-treated diamond samples.

Example 3

Figure 2:
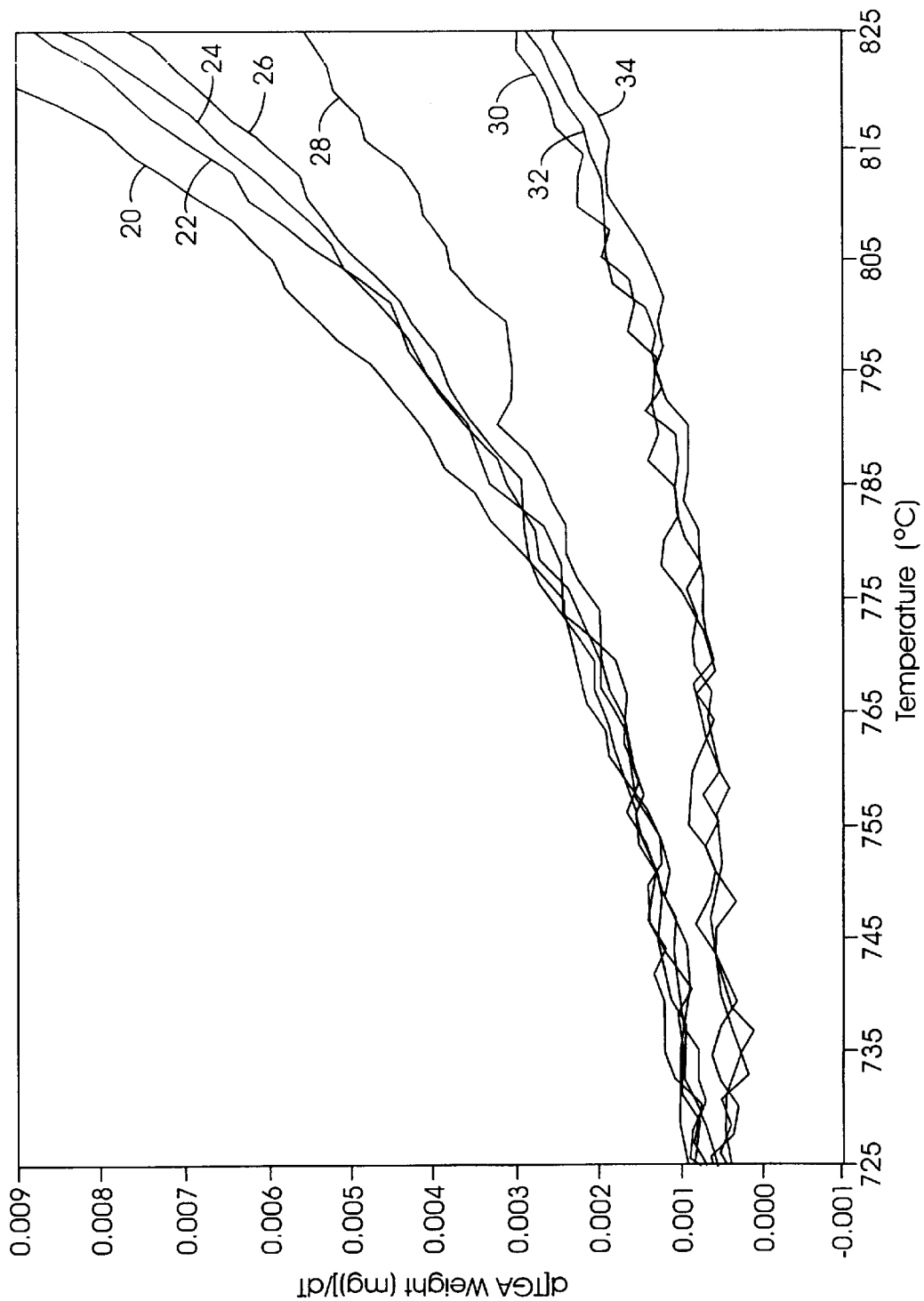
FIG. 2 is the graphical plot of the thermogravimetric analysis results of additional samples of boron diffused diamond samples and several comparative samples.

Additional samples of 1 wt-% and 5 wt-% B diffused diamond samples were compared to untreated diamond, diamond treated in the treated with 0% B, diamond coated with Ti and the Ti coating stripped, and diamond coated with TiB and the TiB coating stripped. Again, TGA analysis was performed in air; however, in this example, the change in weight (mg) per unit change in temperature was plotted versus the TGA temperature. The results are displayed in FIG. 2, wherein curve 20 an untreated sample, curve 22 is a sample treated with 0% B, curve 24 is a Ti coated sample, curve 26 is a Ti coated sample that has been stripped of its Ti coating, curve 28 is a TiB coated sample that has been stripped of its TiB coating, curve 30 is a sample treated with 1% B, curves 32 and 34 are samples that have been treated with 5% B.

Again, these TGA test results reveal the enhanced oxidation resistance that the B diffused samples display versus untreated diamond, treated diamond with no B, and two different Ti coated diamond samples. The rate of weight loss per unit temperature change is much less for the inventive B diffused samples than for the comparative samples.

What is claimed is:

1. A method for treating diamond for improving the oxidation resistance and the mechanical strength of said diamond crystals, which comprises:
   (a) forming a mixture of diamond crystals, a source of boron, and inert particles; and
   (b) heating said mixture at a temperature of between about 800° and 1200° C. for a time adequate to diffuse boron into the surface of said diamond crystals for improving the oxidation of said boron-diffused diamond crystals.

2. The method of claim 1, wherein said diamond crystals range in size up to about 900 $\mu$m in size.

3. The method of claim 1, wherein said inert particles are one or more of alumina, magnesium oxide, or silicon oxide.

4. The method of claim 1, wherein said inert particles are alumina particles having a particle size ranging from between about 1 $\mu$m to 80 mesh.

5. The method of claim 1, wherein said mixture is heated for a time period ranging from about 2 to 4 hours.

6. The method of claim 1, wherein said source of boron comprises boron powder.

7. The method of claim 6, wherein said boron powder ranges in size from between about 5 $\mu$m to about 80 mesh.

8. The method of claim 4, wherein said diamond crystals range in size up to about 900$\mu$ in size, said boron comprises boron powder ranges in size from between about 5 $\mu$m to about 80 mesh, and said mixture is heated for a time period ranging from about 2 to 4 hours.

9. Diamond crystals having improved oxidation resistance by virtue of having had boron thermally diffused into the surface of said diamond crystals.

10. Diamond crystals of claim 9, wherein said boron was thermally diffused by heating a mixture of diamond crystals, a source of boron, and inert particles at a temperature of between about 800° and 1200° C. for a time adequate to diffuse boron into the surface of said diamond crystals.

11. Diamond crystals of claim 9, which range in size up to about 900 $\mu$m.

12. Diamond crystals of claim 10, which range in size up to about 900 $\mu$m.

13. Diamond crystals having improved mechanical strength by virtue of having had boron thermally diffused into the surface of said diamond crystals.

14. Diamond crystals of claim 13, wherein said boron was thermally diffused by heating a mixture of diamond crystals, a source of boron, and inert particles at a temperature of between about 800° and 1200° C. for a time adequate to diffuse boron into the surface of said diamond crystals.

15. Diamond crystals of claim 13, which range in size up to about 900 $\mu$m.

16. Diamond crystals of claim 14, which range in size up to about 900 $\mu$m.

* * * * *